US007778676B2

(12) United States Patent
Keski-Opas

(10) Patent No.: US 7,778,676 B2
(45) Date of Patent: Aug. 17, 2010

(54) ESD PROTECTION FOR LCD PANELS AND THE LIKE

(75) Inventor: Petri Keski-Opas, Tampere (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/939,091

(22) Filed: Sep. 10, 2004

(65) Prior Publication Data

US 2006/0055841 A1 Mar. 16, 2006

(51) Int. Cl.
*H04M 1/10* (2006.01)

(52) U.S. Cl. .................................... 455/575.1; 361/112

(58) Field of Classification Search ................ 455/90.3, 455/550.1, 566, 575.1, 575.8; 361/816; 379/451; 348/14.01–14.07
See application file for complete search history.

(56) References Cited

U.S. PATENT DOCUMENTS

| | | | | |
|---|---|---|---|---|
| 6,483,719 | B1 * | 11/2002 | Bachman | 361/816 |
| 6,728,555 | B1 * | 4/2004 | Pirila et al. | 455/566 |
| 2003/0062180 | A1 * | 4/2003 | Jones | 174/35 GC |
| 2003/0201111 | A1 | 10/2003 | Jensen et al. | |
| 2006/0229502 | A1 * | 10/2006 | Pollock et al. | 600/300 |

FOREIGN PATENT DOCUMENTS

| | | | |
|---|---|---|---|
| GB | 2336019 | A | 6/1999 |
| JP | 11143396 | A * | 5/1999 |

* cited by examiner

*Primary Examiner*—Rafael Pérez-Gutiérrez
*Assistant Examiner*—Marcos Batista

(57) ABSTRACT

A display panel is mount behind a conductive structure with a gasket sandwiched between the panel and the conductive structure. ESD protection is provided by holes through the gasket between the panel and the conductive structure.

23 Claims, 5 Drawing Sheets

20
20a
20b
20c

ESD PROTECTION FOR LCD PANELS AND THE LIKE

FIELD OF THE INVENTION

The present invention relates to the protection of display devices that are susceptible to damage by electrostatic discharges (ESD).

BACKGROUND TO THE INVENTION

Liquid crystal display (LCD) panels are widely used in electronic devices. However, these devices are susceptible to damage by ESD. For this reason, LCD panels are often installed in close proximity to conductive structures.

It is known to mount an LCD panel behind an aperture in a conductive bezel. An elastomeric grommet-like gasket is mounted in the aperture to protect the LCD panel against mechanical shocks and the ingress of moisture.

It has been found that electrostatic discharges can propagate across the surface of the gasket to the edge of an LCD panel, damaging it.

SUMMARY OF THE INVENTION

It is an object of the present invention to provide a display panel installation arrangement which reduces the risk of ESD damage to the display panel.

According to the present invention, there is provided an electronic device, for instance an instrument, a personal digital assistant (PDA) or a personal communication device such as a mobile phone (aka cell phone), comprising a conductive structure having an opening, a display panel viewable through said opening and a gasket having at least a portion thereof sandwiched between the display panel and said structure, wherein the gasket has an aperture extending between the display panel and said structure. The aperture or apertures provide a path to ground that has a lower impedance than the path through the display. Since the apertures are behind the structure, through which the display device panel is visible, they do not detract from the appearance of the device, irrespective of whether there is an additional external cover.

The gasket may have a plurality of apertures extending between the display panel and said structure.

The apertures may be closely spaced, e.g. 2 mm to 7 mm (preferably about 4 mm).

The may have apertures have cross-sections that are circular or regularly polygonal. However, the apertures could be slits or slots or have other irregularly polygonal cross-sections. The holes may be small, e.g. having diameters of 0.5 to 2 mm, preferably about 1 mm. Thus the small amount of material removed does not have a significant adverse effect of the prevention of moisture and dust ingress and shock prevention properties of the gasket.

The gasket may have a channel which receives at least a portion of the edge of said structure around said opening. However, the gasket could have an L-shaped cross-section with the upright of the L projecting at least partially through the opening in said structure. The gasket could even be flat.

The gasket may extend fully or partially around the opening.

The display panel may be an LCD panel or another display type that is susceptible to damage from ESD.

DETAILED DESCRIPTION OF PREFERRED EMBODIMENTS

Exemplary preferred embodiment of the present invention will now be described by way of example with reference to the accompanying drawings.

Figure 1:
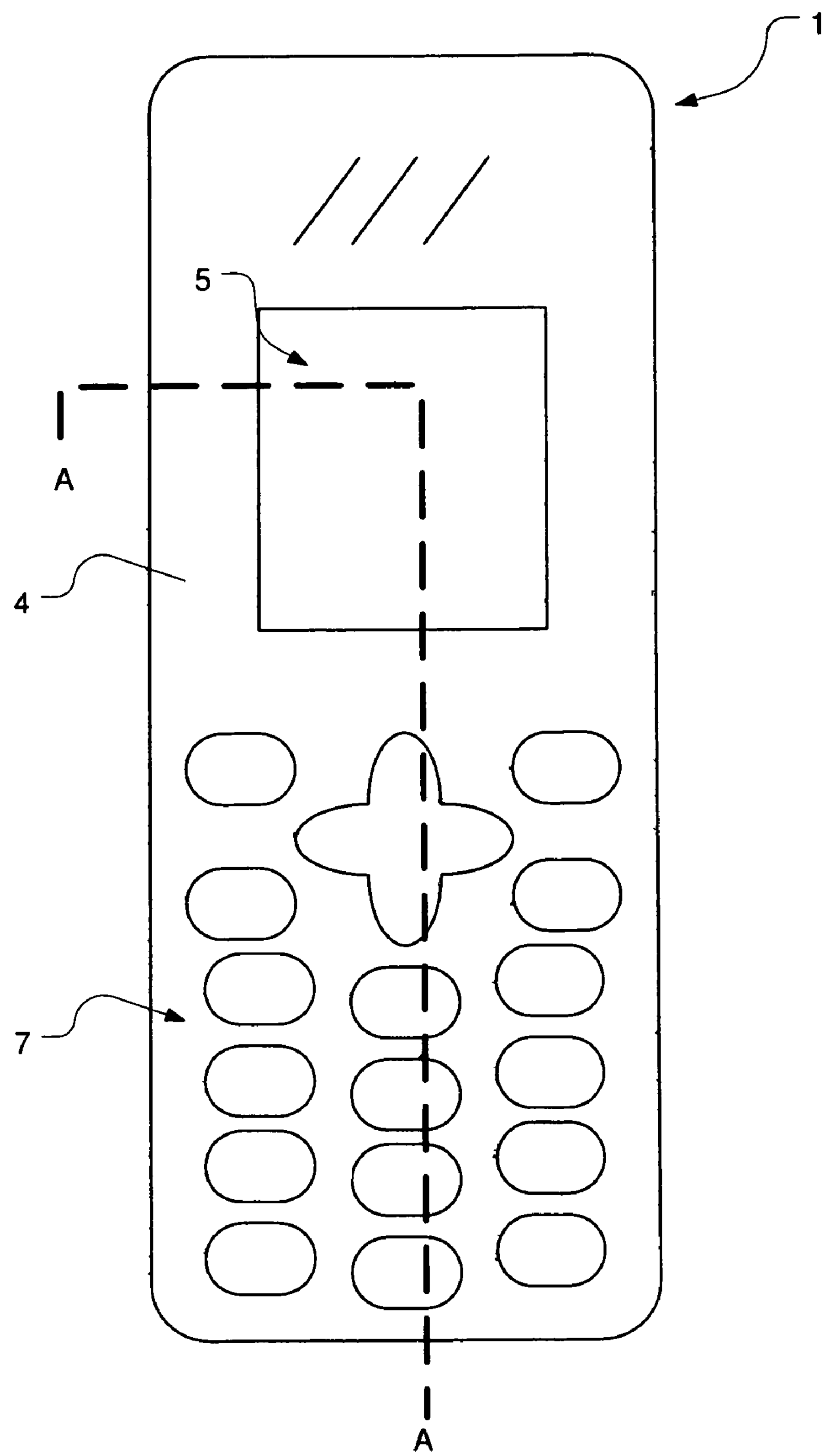
FIG. 1 is a front view of a mobile phone in which the present invention is embodied.
Figure 2:
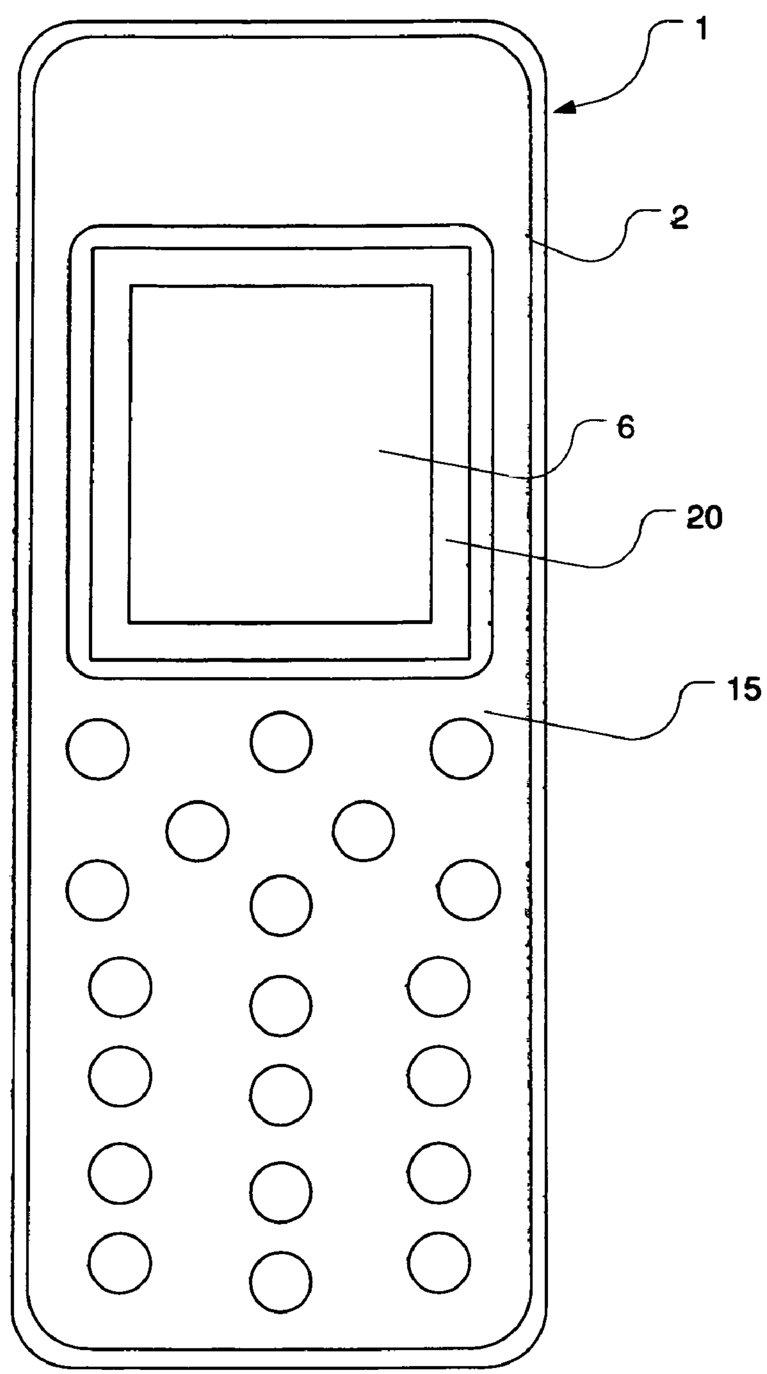
FIG. 2 is a front view of the mobile phone of FIG. 1 with its front cover and keymat removed.
Figure 3:
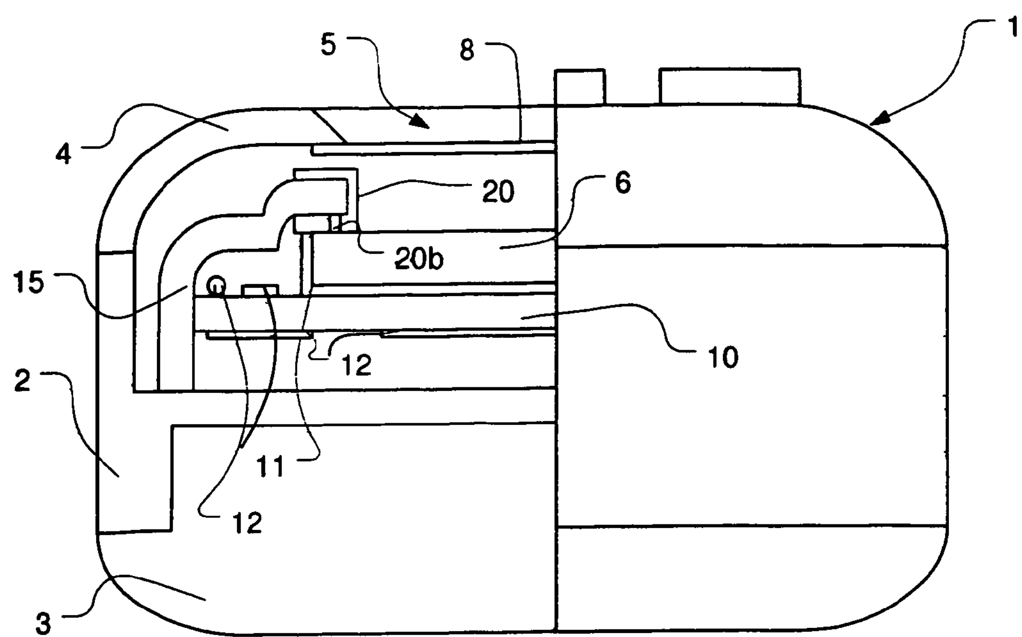
FIG. 3 is a partial section view of the mobile phone of FIG. 1 along the line A-A.

Referring to FIGS. 1 to 3, a mobile phone 1, according to the present invention, comprises a generally H-section frame 2 with a battery 3 mounted to the back of the frame 2 and a front cover 4 clipped to the front of the frame 2. A rectangular aperture 5 is provided in the front cover 4 so that an LCD panel 6 can be viewed. The front panel 4 also has an array of holes through which the buttons 7 of an underlying keymat project. A transparent plastic sheet 8 is glued across the back of the aperture 5.

A printed circuit board (PCB) 10 is mounted to the front of the frame 2. An LCD panel mount 11 is fixed to the front of the PCB 10. The PCB 10 also carries various other electronic components 12 necessary for the functioning of the mobile phone 1.

A conductive shield 15 covers the PCB 10 between the frame 2 and the front cover 4. The shield 15 extends from the front face of the frame 2 towards the front of the mobile phone 1 and across the front of the PCB 10. The shield 15 bulges outwards in front of the LCD panel 6 and is apertured so that the LCD 6 can be viewed.

A rubber grommet-like gasket 20 is mounted around the edge of the aperture in the shield 15. The back face of the gasket 20 is in contact with the front of the LCD panel 6.

Figure 4:
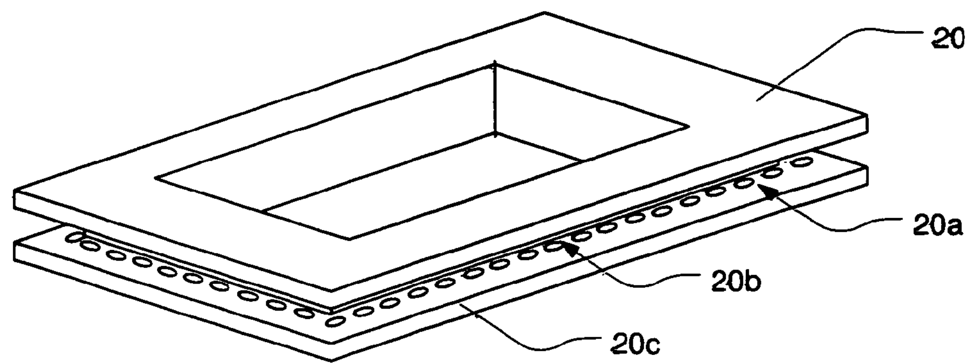
FIG. 4 is a perspective view of a grommet-like gasket of the mobile phone of FIG. 1.

Referring additionally to FIG. 4, the gasket 20 is rectangular and relatively flat and has a channel **20*a* running around its edge. The channel 20*a* receives the edges of the shield 15**, surrounding the LCD aperture, when it is installed.

Figure 5:
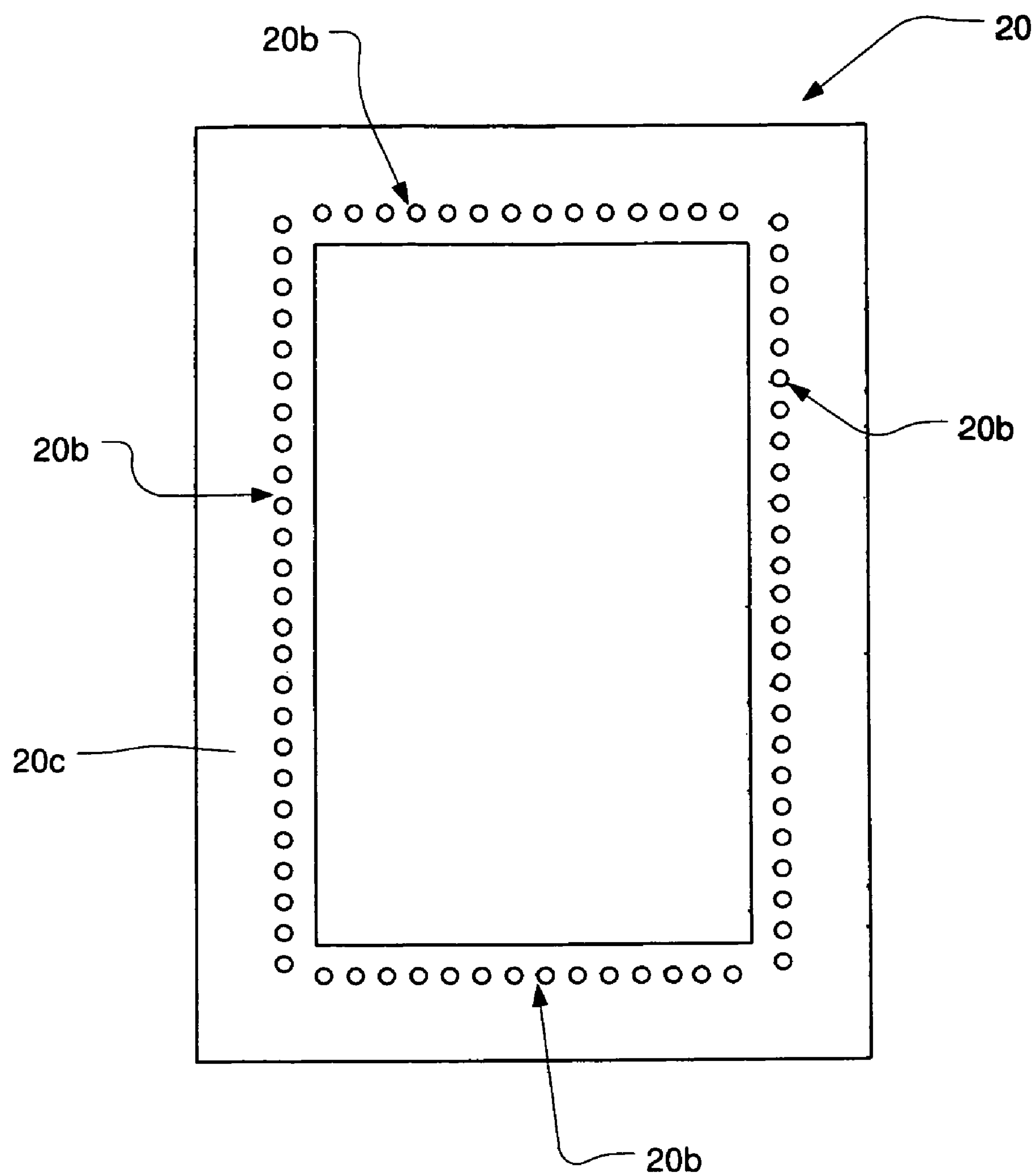
FIG. 5 is a rear view of the gasket of FIG. 4.

Referring additionally to FIG. 5, a plurality of closely spaced, e.g. 2 mm to 7 mm (preferably 4 mm), circular cross-section holes **20*b* are provided through the rear flanges 20*c* of the gasket 20. The holes 20*b* are 1 mm in diameter and are arranged in a straight line along each side of the gasket's central opening and are preferable as close to the bottom of the channel 20 as practicable. As shown in FIG. 3, the holes 20*b* are located within the periphery of the front face of the LCD panel 6. Consequently, they lie sufficiently in the path of an electrostatic discharge propagating across the surface of the gasket 20 towards the periphery of the front face of the LCD panel 6 to prevent it reaching the LCD panel 6**.

Figure 6:
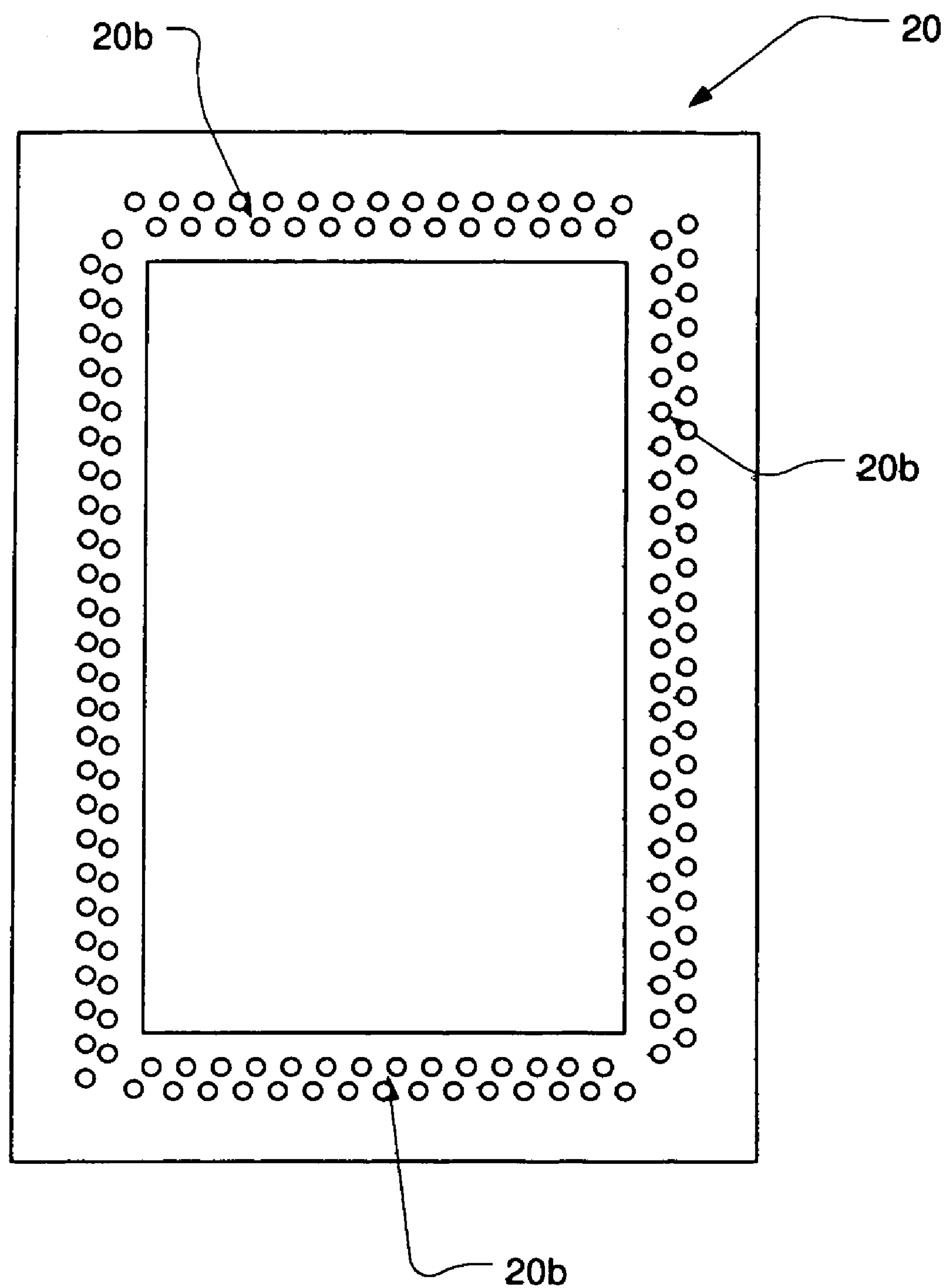
FIG. 6 is a rear view of the gasket of another embodiment of the present invention.

Referring to FIG. 6, in another embodiment which is substantially as described with reference to FIGS. 1 to 5, the gasket 20 has its hole **20*b*** arranged in two staggered lines along each side of its central opening.

It will be appreciated that many modifications may be made to the embodiments described above. In particular, the shape and size of the gasket may be varied to suit the shape and size of the display panel. Also, the holes in the gasket may only need to be provided near parts of the display that are particularly susceptible to damage from ESD.

What is claimed is:

1. An electronic device comprising:

a conductive structure having an opening;

a display panel having a periphery, the display panel being viewable through said opening, and a gasket configured as a ring with electrically insulating external surfaces that includes a central opening allowing the display panel to be viewed, the gasket being in direct contact with the display panel and having at least a portion thereof sandwiched between the display panel and said structure, wherein the gasket has a plurality of closely spaced apertures with electrically insulating external surfaces extending between the display panel and said structure, the apertures configured to lie substantially in a path of an electrostatic discharge propagating across a surface of the gasket towards the display panel to prevent the electrostatic discharge from reaching the periphery of the panel.

2. An electronic device according to claim, 1 wherein said plurality of apertures are spaced apart by a distance in a range of approximately 2 mm to 7 mm.

3. An electronic device according to claim 1, wherein said apertures have cross-sections that are substantially circular or regularly polygonal.

4. An electronic device according to claim 1, wherein the gasket has a channel which receives at least a portion of the edge of said structure around said opening, and wherein the gasket further comprises a channel member formed along a periphery of the gasket, the channel member configured to receive an edge portion of the conductive structure between a first lip member and a second lip member, the second lip member being sandwiched between the display panel and the conductive structure and the closely spaced apertures being formed in the second lip member.

5. An electronic according to claim 1 wherein the gasket extends fully around said opening.

6. The device of claim 1 wherein each aperture in the plurality of apertures provides a path to a ground plane that has a lower impedance than a path across the display panel.

7. The device of claim 1 wherein the plurality of apertures are arranged as a ring that extends around the central opening.

8. The device of claim 1 wherein the plurality of apertures are arranged in a substantially straight-line along each side of the central opening.

9. The device of claim 8 wherein the plurality of apertures are arranged close to the bottom of a channel around the edge of the gasket that is configured to receive edges of the conductive structure.

10. The device of claim 8 wherein the plurality of apertures are arranged in two rows along each side of the central opening, one row being offset from an other row.

11. The device of claim 1 wherein the apertures are only provided near parts of the display that are susceptible to electrostatic discharge.

12. The device of claim 1 wherein the plurality of closely spaced apertures are sandwiched between the display panel and the conductive structure.

13. An electronic device comprising:

a conductive structure having an opening;

a display panel having a periphery, the display panel being viewable through said opening; and a gasket configured as a ring with electrically insulating external surfaces, the gasket having a central opening allowing the display panel to be viewed, the gasket extending fully around said opening, the gasket being in direct contact with the display panel and having at least a portion thereof sandwiched between the display panel and said structure, wherein the gasket has a plurality of apertures with electrically insulating external surfaces extending between the display panel and said structure in a ring around said opening, the plurality of apertures being spaced apart from one another by a distance in a range of approximately 2 mm through 7 mm, the apertures configured to lie substantially in a path of an electrostatic discharge propagating across an electrically conductive surface of the gasket towards the display panel to prevent the electrostatic discharge from reaching the periphery of the panel.

14. An electronic device according to claim 13, wherein said apertures have cross-sections that are circular or regularly polygonal.

15. An electronic device according to claim 13, wherein the gasket has a channel which receives at least a portion of the edge of said structure around said opening, and wherein the gasket further comprises a channel member formed along a periphery of the gasket, the channel member configured to receive an edge portion of the conductive structure between a first lip member and a second lip member, the second lip member being sandwiched between the display panel and the conductive structure and the closely spaced apertures being formed in the second lip member.

16. The electronic device of claim 13 further comprising that the plurality of closely spaced apertures are sandwiched between the display panel and the conductive structure.

17. A personal communication device comprising:

a conductive structure having an opening:

a display panel viewable through said opening; and a gasket configured as a ring with electrically conductive surfaces and extending fully around said opening, the gasket having a central opening to allow the display panel to be viewed, the gasket being in direct contact with the display panel and having at least a portion thereof sandwiched between the display panel and said structure, wherein the gasket has a plurality of apertures with electrically insulating external surfaces configured to extend between the display panel and said structure substantially, the plurality of apertures forming a ring around said opening, said plurality of apertures being spaced apart by a distance that is in a range of approximately 2 mm through 7 mm, the plurality of apertures being configured to lie substantially in a path of an electrostatic discharge propagating across a surface of the gasket towards the display panel to prevent the electrostatic discharge from reaching the periphery of the display panel.

18. A personal communication device according to claim 17, wherein the gasket has a plurality of apertures extending between the display panel and said structure.

19. A personal communication device according to claim 18, wherein said apertures are closely spaced.

20. A personal communication device according to claim 18, wherein said apertures have cross-sections that are circular or regularly polygonal.

21. A personal communication device according to claim 17, wherein the gasket has a channel which receives at least a portion of the edge of said structure around said opening and the method further comprises forming a channel member along a periphery of the gasket, the channel member configured to receive an edge portion of the conductive structure between a first lip member and a second lip member, the second lip member being sandwiched between the display panel and the conductive structure and forming the closely spaced apertures in the second lip member.

22. A method of inhibiting an electrostatic discharge in a personal communication device comprising:

providing a conductive structure having an opening, a display panel viewable through the opening and a gasket configured as a ring with electrically insulating surfaces extending around the opening and including a central opening to allow the display panel to be viewed, the gasket being in direct contact with the display panel and having at least a portion thereof sandwiched between the display panel and the structure;

providing the gasket with a plurality of closely spaced apertures with electrically insulating external surfaces extending between the display panel and the structure, the plurality of apertures forming a ring of apertures around the opening; and configuring the plurality of closely spaced apertures to lie substantially in a path of an electrostatic discharge propagating across an electrically insulating surface of the gasket towards the display panel to prevent the electrostatic discharge from reaching the periphery of the panel.

23. The method of claim 22 wherein the plurality of closely spaced apertures are sandwiched between the display panel and the conductive structure.

* * * * *

CERTIFICATE OF CORRECTION

PATENT NO. : 7,778,676 B2
APPLICATION NO. : 10/939091
DATED : August 17, 2010
INVENTOR(S) : Petri Keski-Opas It is certified that error appears in the above-identified patent and that said Letters Patent is hereby corrected as shown below:

Column 3, line 19, delete “claim, 1” and insert --claim 1,-- therefore.

Column 3, line 35, delete “An electronic according to claim 1” and insert --An electronic device according to claim 1-- therefore.

Signed and Sealed this

Thirtieth Day of November, 2010

David J. Kappos
*Director of the United States Patent and Trademark Office*